US010292269B1

(12) United States Patent
Mudakatte et al.

(10) Patent No.: US 10,292,269 B1
(45) Date of Patent: May 14, 2019

(54) INDUCTOR WITH METAL-INSULATOR-METAL (MIM) CAPACITOR

(71) Applicant: QUALCOMM Incorporated, San Diego, CA (US)

(72) Inventors: Niranjan Sunil Mudakatte, San Diego, CA (US); Changhan Hobie Yun, San Diego, CA (US); Jonghae Kim, San Diego, CA (US); Xiaoju Yu, San Diego, CA (US); Nosun Park, Incheon (KR); Mario Francisco Velez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/950,865

(22) Filed: Apr. 11, 2018

(51) Int. Cl.
*H05K 1/16* (2006.01)
*H05K 1/18* (2006.01)
*H01L 23/522* (2006.01)
*H03H 7/01* (2006.01)
*H01L 23/66* (2006.01)
*H01L 49/02* (2006.01)

(52) U.S. Cl.
CPC ......... *H05K 1/16* (2013.01); *H01L 23/5223* (2013.01); *H01L 23/5227* (2013.01); *H01L 23/66* (2013.01); *H03H 7/0115* (2013.01); *H03H 7/1741* (2013.01); *H01L 28/10* (2013.01); *H01L 28/40* (2013.01)

(58) Field of Classification Search
CPC .............. H03H 7/0115; H03H 7/1741; H05K 1/16–167; H01L 23/5223; H01L 23/5227; H01L 23/645
See application file for complete search history.

(56) References Cited

U.S. PATENT DOCUMENTS

| 7,169,684 | B2 | 1/2007 | Lee et al. |
| 7,906,831 | B2 | 3/2011 | Baumgartner et al. |
| 8,120,142 | B2 | 2/2012 | Bobde |
| 2010/0079924 | A1* | 4/2010 | Keating ................ H01G 4/012 361/305 |
| 2010/0133652 | A1 | 6/2010 | Atsumo |
| 2015/0228416 | A1* | 8/2015 | Hurwitz ................ H01G 17/00 361/763 |
| 2017/0019140 | A1* | 1/2017 | Nick ....................... H01L 23/66 |
| 2017/0338034 | A1 | 11/2017 | Yun et al. |

* cited by examiner

*Primary Examiner* — Hoa C Nguyen
(74) *Attorney, Agent, or Firm* — Seyfarth Shaw LLP (57) ABSTRACT

An inductor-capacitor (LC) filter includes an inductor having an asymmetric shape including at least one turn. The LC filter also includes serial capacitors coupled to the inductor at only one end of a continuous portion of the inductor. The serial capacitors continues the shape of the inductor. The capacitors are outside of a footprint of the continuous portion of the inductor.

20 Claims, 9 Drawing Sheets

INDUCTOR WITH METAL-INSULATOR-METAL (MIM) CAPACITOR

BACKGROUND

Field

Aspects of the present disclosure relate to semiconductor devices and, more particularly, to inductor-capacitor (LC) filters.

Background

Designing mobile radio frequency (RF) chips (e.g., mobile RF transceivers) is complicated by added circuit functions for supporting communication enhancements, such as fifth generation (5G) wireless systems. Designing mobile RF transceivers may include using acoustic filters and resonators for processing analog signals. Many passive devices may be included in such filters and resonators. These passive devices may include many inductors and capacitors.

Implementing 5G wireless systems increasingly involves the use of additional capacitors. For example, 2D passive-on-glass (POG) filters leverage stacked copper (Cu) inductors and copper/silicon nitride (SiN)/copper (Cu/SiN/Cu) metal-insulator-metal (MIM) capacitors. Due to the complexity of 5G wireless systems, existing design rules limit implementation of small capacitors. Currently, minimum capacitor dimensions are around 50 microns by 50 microns. At higher frequencies (e.g., three gigahertz (GHz) and above), low capacitance values are used, thereby increasing capacitor size due to serial capacitor stacking. The increased series capacitor stacking results in a larger POG filter size. For example, six to ten series capacitor stacks are used in POG circuits. Capacitor stacking in a meandering/multi-stacked formation increases parasitic resistance, which impedes a quality (Q)-factor of an inductor-capacitor (LC) filter.

It is therefore desirable to implement an inductor-capacitor (LC) filter that overcomes these deficiencies, while providing an improved Q-factor.

SUMMARY

An inductor-capacitor (LC) filter may include an inductor having an asymmetric shape having at least one turn. The LC filter may further include serial capacitors coupled to the inductor at only one end of a continuous portion of the inductor. The serial capacitors may continue the shape of the inductor. The capacitors may be outside of a footprint of the continuous portion of the inductor.

A method of fabricating a single-ended radio frequency integrated circuit (RFIC) may include fabricating an inductor having an asymmetric shape including at least one turn. The method may further include coupling serial capacitors to the inductor at only one end of a continuous portion of the inductor. The serial capacitors may continue the shape of the inductor. The serial capacitors may be outside of a footprint of the continuous portion of the inductor.

An inductor-capacitor (LC) filter may include an inductor having an asymmetric shape including at least one turn. The LC filter may further include means for storing charge coupled to the inductor at only one end of a continuous portion of the inductor. The charge storing means may continue the shape of the inductor. The charge storing means may be outside of a footprint of the continuous portion of the inductor.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. Other aspects, as well as features and advantages of various aspects, will become apparent to those of skill in the art through consideration of the ensuing description, the accompanying drawings, and the appended claims.

The use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

The term "2D inductor" used throughout this description means "an inductor that is substantially planar in shape having coils limited to a single interconnect layer that do not extend into other interconnect layers." The term "3D inductor" used throughout this description means an inductor having coils in multiple interconnect layers.

Mobile radio frequency (RF) chip designs (e.g., mobile RF transceivers) have migrated to a deep sub-micron process node due to cost and power consumption considerations. The design complexity of mobile RF transceivers is further complicated by added circuit functions for supporting communication enhancements, such as fifth generation (5G) wireless systems. Further design challenges for mobile RF transceivers include analog/RF performance considerations, including mismatch, noise, and other performance considerations. The design of these mobile RF transceivers includes passive devices, for example, to suppress resonance and/or to perform filtering, bypassing, and coupling.

The passive devices include high-performance inductor and capacitor components having a variety of advantages over other technologies, such as surface mount technology or multi-layer ceramic chips. These advantages include a more compact size and smaller manufacturing variations.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency (e.g., 500 megahertz (MHz) to 5 gigahertz (GHz) RF range).

Designing mobile radio frequency (RF) chips (e.g., mobile RF transceivers) is complicated by added circuit functions for supporting communication enhancements. Designing mobile RF transceivers may include using acoustic filters and resonators for processing signals carried in a communication system. Many passive devices may be included in such filters and resonators. Each of these passive devices may include many inductors and capacitors.

Implementing 5G wireless systems increasingly involves using additional capacitors. For example, 2D passive-on-glass (POG) filters leverage stacked copper (Cu) inductors and copper/silicon nitride (SiN)/copper (Cu/SiN/Cu) metal-insulator-metal (MIM) capacitors. Due to the complexity of 5G wireless systems, existing design rules limit implementation of small capacitors. Currently, minimum capacitor dimensions are around 50 microns by 50 microns. At higher frequencies (e.g., three GHz and above), low capacitance values are used, thereby increasing capacitor size due to serial capacitor stacking. The increased series capacitor stacking results in a larger POG filter size. For example, six to ten series capacitor stacks are used in POG circuits. Capacitor stacking in a meandering/multi-stacked formation increases parasitic resistance, which impedes a quality (Q)-factor of an inductor-capacitor (LC) filter.

Aspects of the present disclosure describe an inductor-capacitor (LC) filter that overcomes these deficiencies. The LC filter may include an inductor having an asymmetric shape and at least one turn. The LC filter may further include serially connected capacitors coupled to the inductor at only one end of a continuous portion of the inductor. The capacitors may continue the shape of the inductor and may be outside a footprint of the continuous portion of the inductor.

Figure 1:
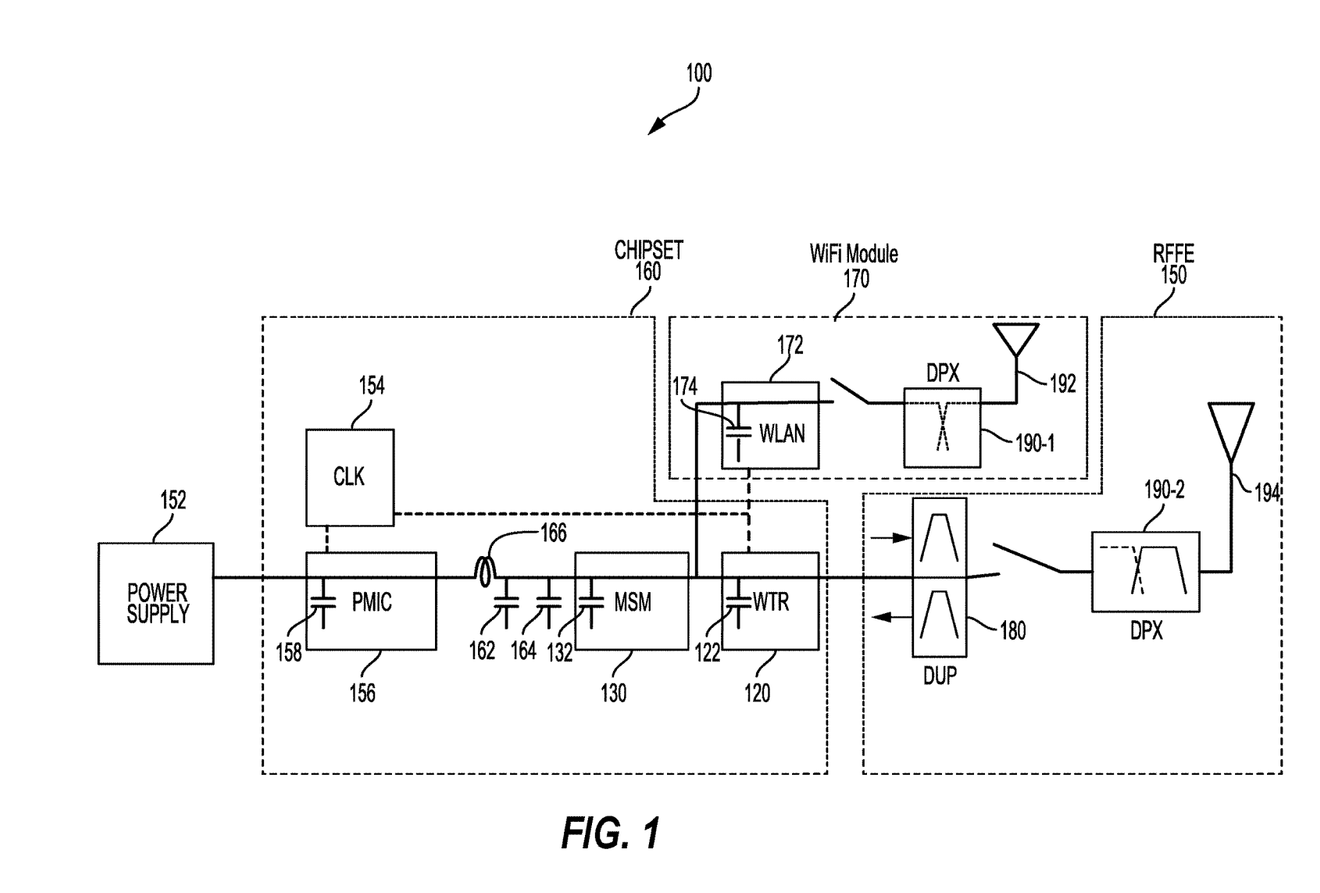
FIG. 1 is a diagram of a radio frequency (RF) communication system.

FIG. 1 is a schematic diagram of a radio frequency (RF) communications system 100 including an inductor-capacitor (LC) filter integrated with a duplexer 180 according to an aspect of the present disclosure. Representatively, the RF communications system 100 includes a WiFi module 170 having a first diplexer 190-1 and an RF front-end module 150 including a second diplexer 190-2 for a chipset 160 to provide carrier aggregation according to an aspect of the present disclosure. The WiFi module 170 includes the first diplexer 190-1 communicably coupling an antenna 192 to a wireless local area network module (e.g., WLAN module 172). The RF front-end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a power amplifier with integrated duplexer (PAMiD) module). The duplexer 180 may filter the input/output signals according to a variety of different parameters, including frequency, insertion loss, rejection, or other like parameters.

Figure 2:
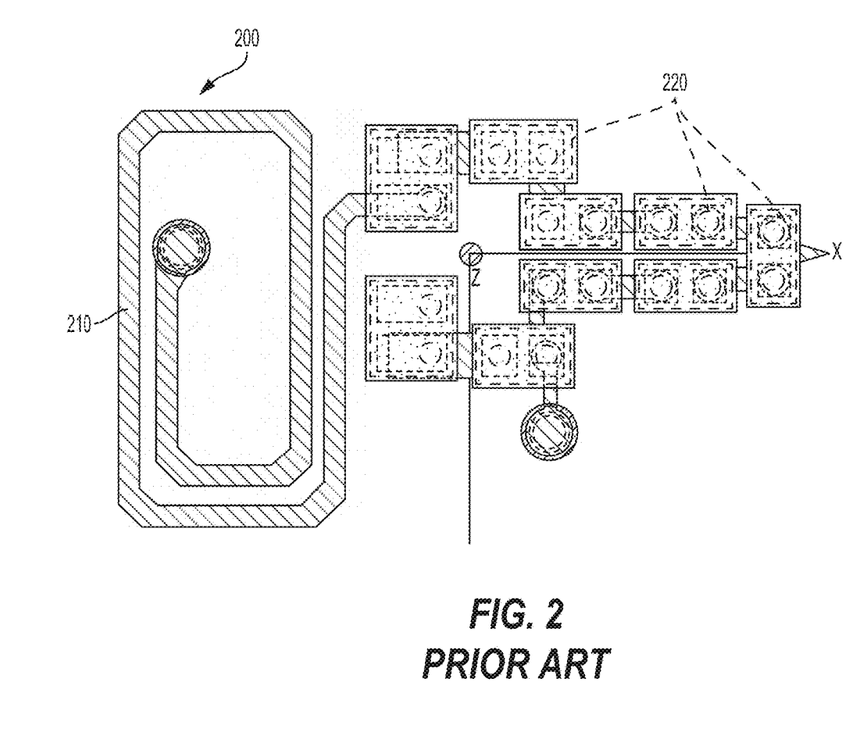
FIG. 2 illustrates a conventional inductor-capacitor (LC) filter.

FIG. 2 illustrates a conventional inductor-capacitor (LC) filter 200. The LC filter 200 includes an inductor 210 coupled to capacitors 220. As illustrated, the capacitors 220 are coupled to the inductor 210, outside the turns of the inductor 210. The capacitors 220 are stacked in series for providing low value capacitances. Unfortunately, the stacking of capacitors increases a size of a die when the LC filter 200 is integrated on a chip. Additionally, the stacking also increases parasitic resistance, which impedes a quality (Q)-factor of the LC filter 200.

Aspects of the present disclosure provide an inductor-capacitor (LC) filter that overcomes these deficiencies. The LC filter may take advantage of an equivalent series inductance (ESL) of capacitors for improving the Q-factor of the LC filter. The LC filter may include an inductor having an asymmetric shape and at least one turn. The LC filter may further include serially connected capacitors coupled to the inductor at only one end of the inductor. The capacitors may continue the shape of the inductor and may be outside of a footprint of the inductor.

Figure 3A:
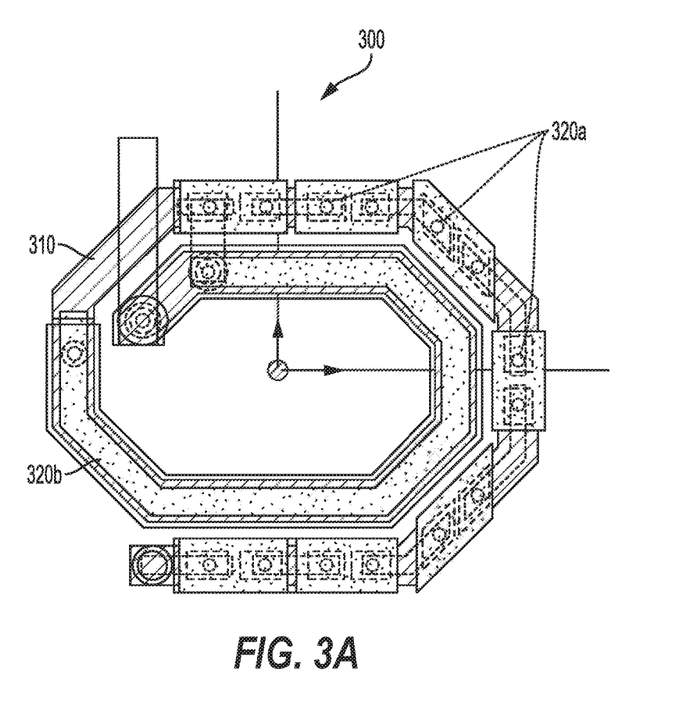
FIG. 3A illustrates a top view of an inductor-capacitor (LC) filter, according to aspects of the present disclosure.

FIG. 3A illustrates a top view of an inductor-capacitor (LC) filter 300, according to aspects of the present disclosure. For example, the LC filter 300 may be implemented in a single-ended radio frequency integrated circuit (RFIC).

The LC filter 300 may include an inductor 310 coupled to capacitors 320*a*, 320*b*. For example, the inductor 310 may be a 2D or 3D inductor, and the capacitors 320*a*, 320*b* may be metal-insulator-metal (MIM) capacitors (e.g., 320*a*) or a sidewall MIM capacitor (e.g., 320*b*). The capacitors 320*a*, 320*b* may be coupled serially to each other through the trace of the inductor 310. Both of the capacitors 320*a*, 320*b* may follow a trace of the inductor 310.

The inductor 310 may be symmetrical or asymmetrical in shape. Additionally, the shape of the inductor 310 may be square, pentagon, hexagon, heptagon, octagon, circular, spiral, solenoid, etc. Of course, these are exemplary shapes, and other shapes are possible.

According to an aspect of the present disclosure, some of the capacitors 320*a*, 320*b* may be on a different metal layer than the inductor 310. For example, some of the capacitors 320*a*, 320*b* may be on a different interconnect layer than the inductor 310 (e.g., under or over). Additionally, some of the capacitors 320*a*, 320*b* may be on a same interconnect layer as the inductor 310.

According to an aspect of the present disclosure, the inductor 310 may be stacked. For example, some stacks may include the inductor 310 and some stacks may include the capacitors 320*a*, 320*b*.

According to an aspect of the present disclosure, the inductor 310 and the capacitors 320*a*, 320*b* form multiple LC tanks. In this way, an unlimited amount of capacitance may be included while also reducing chip space. Additionally, a parasitic capacitance of the inductor 310 may be used for boosting a capacitance of the capacitors 320*a*, 320*b*. The LC filter 300 may also take advantage of an equivalent series inductance (ESL) of the capacitors 320*a*, 320*b* for improving the Q-factor by at least predetermined amount (e.g., 10%).

As described, the LC filter 300 reduces a die size by a substantial amount (e.g., 30% or more). Additionally, the capacitance may be implemented in many small values using the capacitors 320*a*, 320*b*, which improves functionality at a high frequency (e.g., sub-6 GHz) for 5G wireless systems. Advantages also include increased area for symmetrical passive-on-glass (POG) inductor implementations. An increased parasitic inductance of the capacitors 320*a*, 320*b* also helps in high density specifications by improving inductor density and an overall Q-factor of the LC filter 300.

Figure 3B:
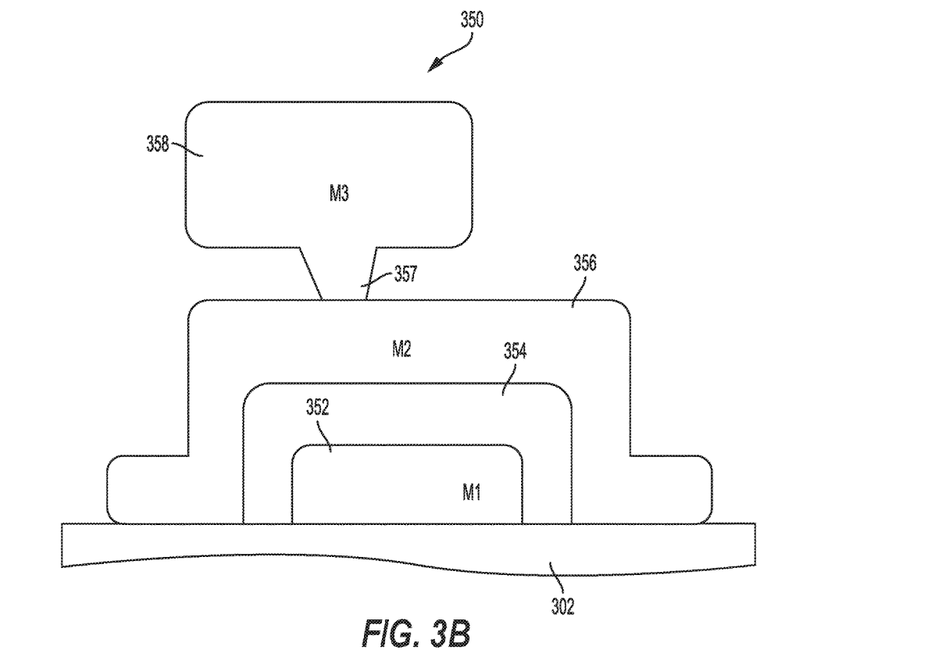
FIGS. 3B and 3C illustrate cross-sectional views of sidewall capacitors, according to aspects of the present disclosure.

FIG. 3B illustrates a cross-sectional view of a sidewall capacitor 350 (e.g., a sidewall metal-insulator-metal (MIM) capacitor), according to aspects of the present disclosure. The sidewall capacitor 350 may be supported by a substrate 302. For example, the substrate 302 may be a passive substrate. The sidewall capacitor 350 may include a first conductive layer 352 (e.g., an M1 metallization layer) covered by a dielectric layer 354. For example, the dielectric layer 354 may directly contact sidewalls of the first conductive layer 352. The dielectric layer 354 may also directly contact a surface of the first conductive layer 352 that is opposite to the substrate 302.

A second conductive layer 356 (e.g., an M2 metallization layer) may surround the dielectric layer 354. For example, the second conductive layer 356 may directly contact sidewalls of the dielectric layer 354. The second conductive layer 356 may also directly contact a surface of the dielectric layer 354 that is opposite to the substrate 302. A via 357 (e.g., V2) may couple the second conductive layer 356 to a third conductive layer 358 (e.g., an M3 metallization layer). The via 357 may be at the M2 metallization layer. Of course, metallization layers M1-M3 are exemplary only, and other metallization layers may also be used. According to aspects of the present disclosure, the first conductive layer 352 and the second conductive layer 356 may be a same conductive layer or a different conductive layer.

Figure 3C:
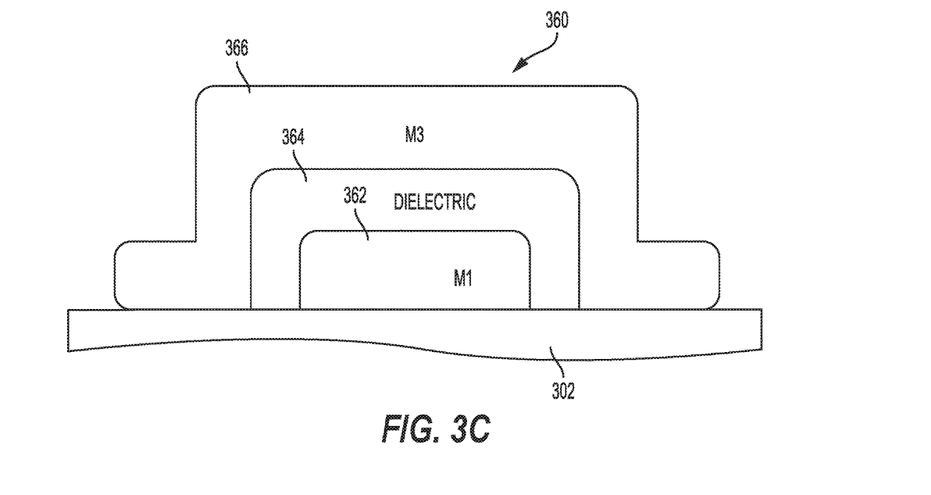

FIG. 3C illustrates a cross-sectional view of another sidewall capacitor 360 (e.g., a sidewall metal-insulator-metal (MIM) capacitor), according to aspects of the present disclosure. The sidewall capacitor 360 may be supported by a substrate 302. The sidewall capacitor 360 may include a first conductive layer 362 (e.g., an M1 metallization layer) covered by a dielectric layer 364. For example, the dielectric layer 364 may also directly contact sidewalls of the first conductive layer 362. The dielectric layer 364 may also directly contact a surface of the first conductive layer 362 that is opposite to the substrate 302.

A second conductive layer 366 (e.g., an M3 metallization layer) may surround the dielectric layer 364. For example, the second conductive layer 366 may directly contact sidewalls of the dielectric layer 364. The second conductive layer 366 may also directly contact a surface of the dielectric layer 364 that is opposite to the substrate 302. Of course, metallization layers M1 and M3 are exemplary only, and other metallization layers may also be utilized.

Figure 4:
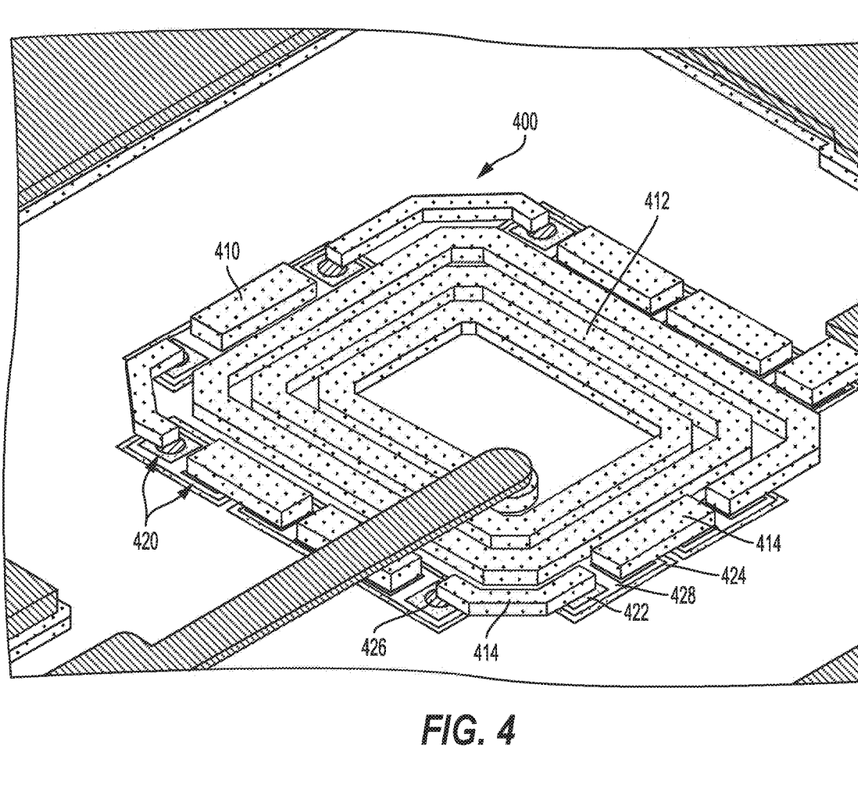
FIG. 4 illustrates a perspective view of an inductor-capacitor (LC) filter, according to aspects of the present disclosure.

FIG. 4 illustrates a perspective view of an inductor-capacitor (LC) filter 400, according to aspects of the present disclosure. For example, the LC filter 400 may include a rectangle inductor 410 coupled to capacitors 420. The capacitors 420 may be metal-insulator-metal (MIM) capacitors. The inductor 410 may include at least one turn, and the capacitors 420 may be outside a footprint of the inductor 410.

Each of the capacitors 420 may couple adjacent traces of the inductor 410 together. For example, the inductor 410 may include a continuous portion 412 and segments 414. The continuous portion 412 may define a trace and a shape of the inductor 410. As illustrated, the shape of the inductor 410 is a rectangle. Of course, other shapes are possible, as described above.

According to aspects of the present disclosure, the segments 414 may be coupled to each other through the capacitors 420, such that the segments 414 continue the shape of the inductor by following and continuing the continuous portion 412 of the inductor 410. For example, each of the capacitors 420 may include a first metal layer 422, a second metal layer 424, and a dielectric layer 428. In this configuration, the second metal layer 424 is a shared plate for two MIM capacitors. Each of the segments 414 may be coupled to each of the capacitors 420 through contact pads 426. In this way, the inductor 410 forms a continuous trace using the capacitors 420. Because the capacitors 420 are included as a part of the inductor 410, a footprint of the LC filter 400 is reduced on a chip.

According to additional aspects of the present disclosure, the inductor 410 is shown on a metal layer supported by the capacitors 420, but the inductor 410 may also be arranged to support the capacitors 420. Similarly, the capacitors 420 are also shown supporting the inductor 410, but the capacitors 420 may be supported by the inductor 410. Although the configuration shown in FIG. 4 illustrates the capacitors 420 as MIM capacitors having a shared plate, other capacitor configurations (e.g., sidewall MIM capacitors) are also possible.

Figure 5:
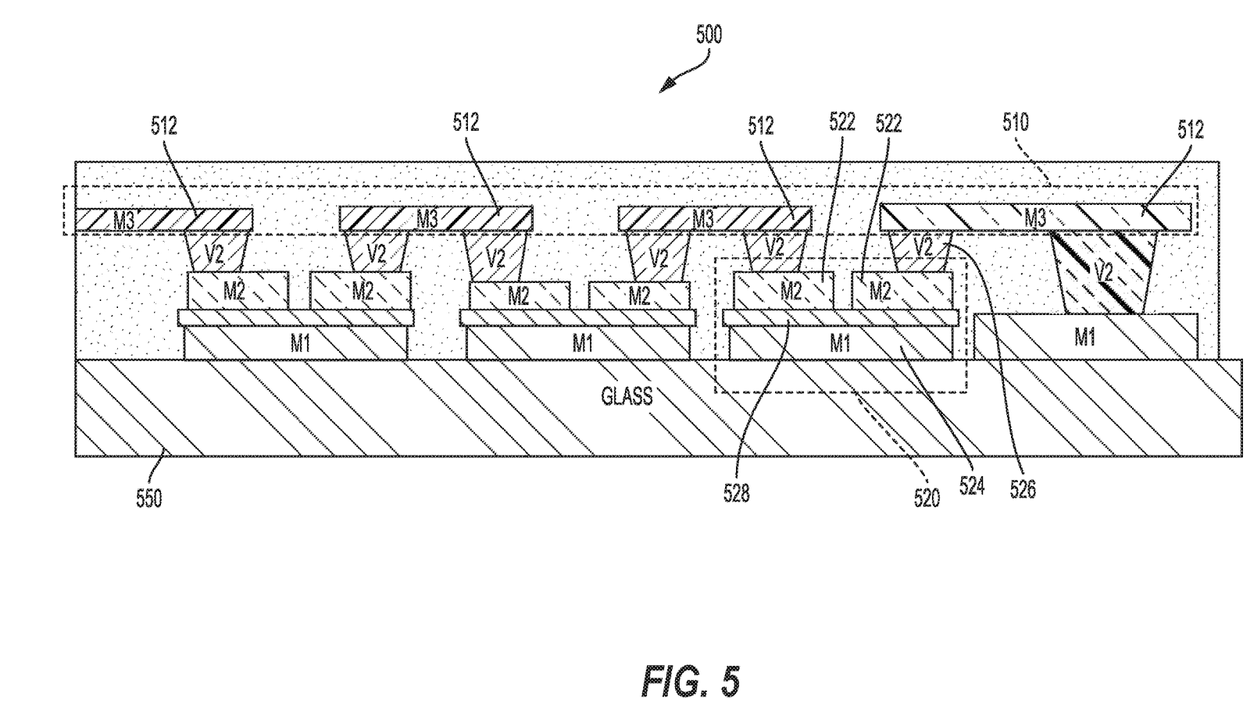
FIG. 5 is a cross-sectional view of an inductor-capacitor (LC) filter, according to aspects of the present disclosure.

FIG. 5 is a cross-sectional view of an inductor-capacitor (LC) filter 500, according to aspects of the present disclosure. For example, the LC filter 500 may include a 3D inductor 510 and capacitors 520. Of course, the inductor 510 may also be a 2D inductor, as described above. Each of the capacitors 520 may include a first metal layer 522, a second metal layer 524, and a dielectric layer 528 between the first metal layer 522 and the second metal layer 524. For example, the first metal layer 522 may be formed on an M2 metal layer, and the second metal layer 524 may be formed on an M1 metal layer. In this configuration, the second metal layer 524 is a shared capacitor plate for MIM capacitor configurations shown in FIG. 5. A glass substrate 550 supports the M1 metal layer.

According to aspects of the present disclosure, the capacitors 520 may couple portions of the inductor 510 together to form a continuous trace. For example, portions 512 of the inductor 510 may be formed on an M3 metal layer. Each of the portions 512 may be coupled at an end to a contact pad 526. For example, the contact pad 526 may be formed on a V2 via layer. Each contact pad 526 couples each of the portions 512 of the inductor 510 to each of the capacitors 520.

According to an aspect of the present disclosure, the inductor 510 may include vertical through-vias (e.g., V2). Additionally, the capacitors 520 may be horizontal (e.g., sidewall MIM capacitors) or vertical capacitors (e.g., MIM capacitors).

Figure 6:
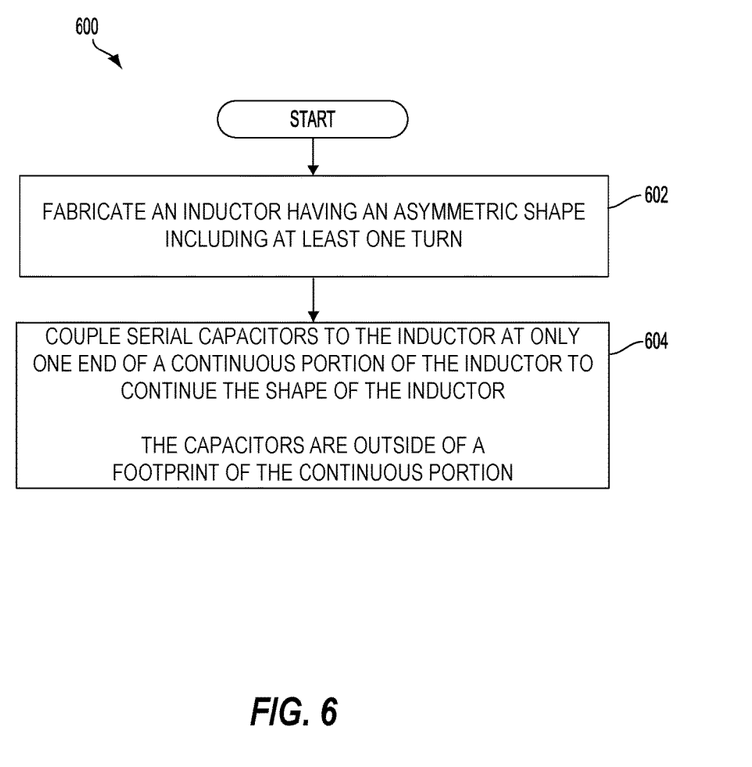
FIG. 6 is a flow diagram illustrating a method of fabricating an inductor-capacitor (LC) filter, according to aspects of the present disclosure.

FIG. 6 is a flow diagram illustrating a method 600 of fabricating a single-ended radio frequency integrated circuit (RFIC), according to aspects of the present disclosure. At block 602, an inductor is fabricated having an asymmetric shape including at least one turn. For example, the inductor 310 may be a 2D or 3D inductor, as shown in FIG. 3A.

At block 604, serial capacitors are coupled to the inductor at only one end of a continuous portion of the inductor to continue the shape of the inductor. The capacitors are outside a footprint of the inductor. For example, the capacitors 420 may be outside of the continuous portion 412 of the inductor 410, as shown in FIG. 4.

According to one aspect of the present disclosure, an inductor-capacitor (LC) filter is described. The LC filter includes means for storing charge. The charge storing means may be, for example, the capacitors 320, 420, 520 in FIGS. 3-5. In another aspect, the aforementioned means may be any module or any apparatus or material configured to perform the functions recited by the aforementioned means.

Figure 7:
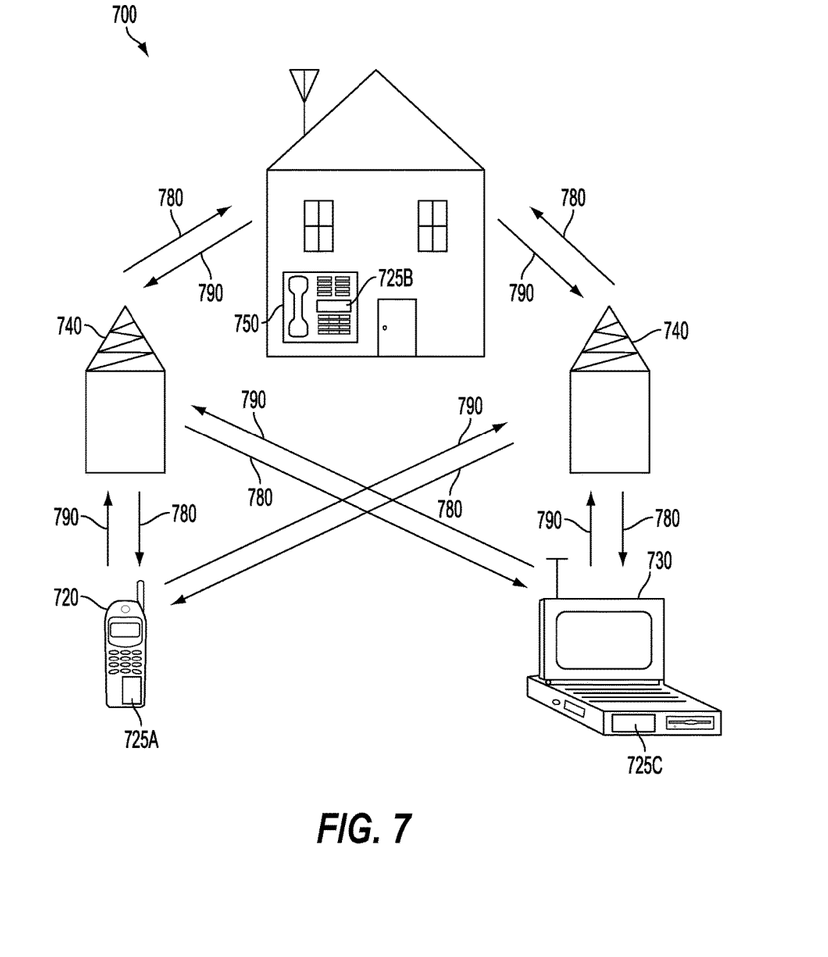
FIG. 7 is a block diagram showing an exemplary wireless communication system in which a configuration of the present disclosure may be advantageously employed.

FIG. 7 is a block diagram showing an exemplary wireless communication system 700 in which an aspect of the present disclosure may be advantageously employed. For purposes of illustration, FIG. 7 shows three of the remote units 720, 730, and 750 and two of the base stations 740. It will be recognized that wireless communication systems may have many more remote units and base stations. Remote units 720, 730, and 750 each include IC devices 725A, 725C, and 725B having a radio frequency (RF) front-end module that includes the disclosed LC filter. It will be recognized that other devices may also include the disclosed inductor-capacitor (LC) filter, such as the base stations, switching devices, and network equipment including a RF front-end module. FIG. 7 shows forward link signals 780 from one of the base stations 740 to the remote units 720, 730, and 750 and reverse link signals 790 from the remote units 720, 730, and 750 to base stations 740.

In FIG. 7, one of the remote units 720 is shown as a mobile telephone, one of the remote units 730 is shown as a portable computer, and remote unit 750 is shown as a fixed location remote unit in a wireless local loop system. For example, the remote units 720, 730, and 750 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front-end module, that stores or retrieves data or computer instructions, or combinations thereof. Although FIG. 7 illustrates remote units according to the aspects of the present disclosure, the present disclosure is not limited to these exemplary illustrated units. Aspects of the present disclosure may be suitably employed in many devices, which include the disclosed LC filter.

Figure 8:
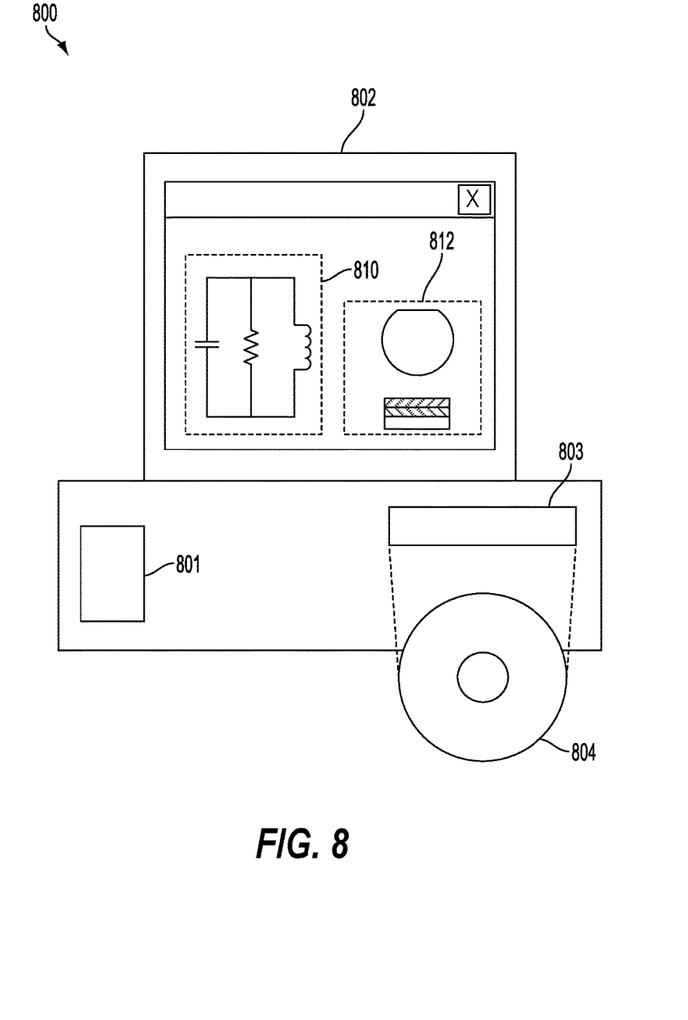
FIG. 8 is a block diagram illustrating a design workstation used for circuit, layout, and logic design of an inductor-capacitor (LC) filter, according to aspects of the present disclosure.

FIG. 8 is a block diagram illustrating a design workstation used for circuit, layout, and logic design of the LC filter disclosed above. A design workstation 800 includes a hard disk 801 containing operating system software, support files, and design software such as Cadence or OrCAD. The design workstation 800 also includes a display 802 to facilitate design of a circuit 810 or the LC filter. A storage medium 804 is provided for tangibly storing the design of the circuit 810 or the LC filter. The design of the circuit 810 or the LC filter may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the LC filter by decreasing the number of processes for designing semiconductor or passive wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this present disclosure that are known or later come to be known to those of ordinary skill in the art are expressly incorporated herein by reference and are intended to be encompassed by the claims. Moreover, nothing disclosed herein is intended to be dedicated to the public regardless of whether such present disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. An inductor-capacitor (LC) filter, comprising:
an inductor having an asymmetric shape including at least one turn; and
a plurality of serial capacitors coupled to the inductor to join a continuous portion of the inductor to inductor segments along the at least one turn and continuing the shape of the inductor, the plurality of capacitors residing outside of a footprint of the continuous portion of the inductor and the inductor segments.

2. The inductor-capacitor (LC) filter of claim 1, in which the plurality of serial capacitors includes a MIM capacitor.

3. The inductor-capacitor (LC) filter of claim 2, in which the MIM capacitor is a sidewall MIM capacitor.

4. The inductor-capacitor (LC) filter of claim 2, in which the MIM capacitor comprises a shared plate.

5. The inductor-capacitor (LC) filter of claim 1, in which the plurality of serial capacitors is on a different conductive layer than the inductor.

6. The inductor-capacitor (LC) filter of claim 1, in which the plurality of serial capacitors are on a same conductive layer as the inductor.

7. The inductor-capacitor (LC) filter of claim 1, in which the inductor comprises a continuous 2D portion and a plurality of discontinuous 3D portions.

8. The inductor-capacitor (LC) filter of claim 1, further comprising a passive substrate on which the inductor and plurality of serial capacitors reside.

9. The inductor-capacitor (LC) filter of claim 1, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

10. A method of fabricating a single-ended radio frequency integrated circuit (RFIC), comprising:
fabricating an inductor having an asymmetric shape including at least one turn; and
coupling a plurality of serial capacitors to the inductor to join a continuous portion of the inductor to inductor segments along the at least one turn and continuing the shape of the inductor, the plurality of serial capacitors residing outside of a footprint of the continuous portion of the inductor and the inductor segments.

11. The method of claim 10, further comprising fabricating the plurality of serial capacitors on a different conductive layer than the inductor.

12. The method of claim 10, further comprising fabricating the plurality of serial capacitors on a same conductive layer as the inductor.

13. The method of claim 10, further comprising fabricating the inductor with a continuous 2D portion and a plurality of discontinuous 3D portions.

14. The method of claim 10, further comprising fabricating the inductor and the plurality of serial capacitors on a passive substrate.

15. The method of claim 10, further comprising integrating the RFIC into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

16. An inductor-capacitor (LC) filter, comprising:
an inductor having an asymmetric shape including at least one turn; and
means for storing charge coupled to the inductor to join a continuous portion of the inductor to inductor segments along the at least one turn and continuing the shape of the inductor, the charge storing means residing outside of a footprint of the continuous portion of the inductor and the inductor segments.

17. The inductor-capacitor (LC) filter of claim 16, in which the charge storing means is on a different conductive layer than the inductor.

18. The inductor-capacitor (LC) filter of claim 16, in which the charge storing means is on a same conductive layer as the inductor.

19. The inductor-capacitor (LC) filter of claim 16, in which the inductor comprises a continuous 2D portion and a plurality of discontinuous 3D portions.

20. The inductor-capacitor (LC) filter of claim 16, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

* * * * *